(12) United States Patent
Lin

(10) Patent No.: US 12,490,409 B2
(45) Date of Patent: Dec. 2, 2025

(54) VAPOR CHAMBER AND MANUFACTURING METHOD THEREOF

(71) Applicant: TAIWAN MICROLOOPS CORP., New Taipei (TW)

(72) Inventor: Chun-Hung Lin, New Taipei (TW)

(73) Assignee: TAIWAN MICROLOOPS CORP., New Taipei (TW)

( * ) Notice: Subject to any disclaimer, the term of this patent is extended or adjusted under 35 U.S.C. 154(b) by 300 days.

(21) Appl. No.: 17/891,112

(22) Filed: Aug. 18, 2022

(65) Prior Publication Data

US 2023/0345670 A1 Oct. 26, 2023

(30) Foreign Application Priority Data

Apr. 25, 2022 (TW) .................................. 111115635

(51) Int. Cl.
*H05K 7/20* (2006.01)
*F28D 15/04* (2006.01)

(52) U.S. Cl.
CPC ........... *H05K 7/2029* (2013.01); *F28D 15/04* (2013.01)

(58) Field of Classification Search
CPC .. H05K 7/2029; H05K 7/0233; H05K 7/0283; H05K 7/046; H05K 7/20309; H05K 7/20318; H05K 7/20336; F28D 15/04; F28D 15/0233; F28D 15/0283; F28D 15/046; H01L 23/427
USPC .................................................. 165/104.26
See application file for complete search history.

(56) References Cited

U.S. PATENT DOCUMENTS

| | | | | |
|---|---|---|---|---|
| 2009/0040726 A1* | 2/2009 | Hoffman | ............. | F28D 15/0233 29/890.032 |
| 2010/0315787 A1* | 12/2010 | Li | ......................... | H05K 1/0206 361/709 |
| 2017/0292793 A1* | 10/2017 | Sun | ......................... | F28F 9/001 |
| 2020/0126890 A1* | 4/2020 | Singh | .................... | H01L 23/427 |
| 2020/0355444 A1* | 11/2020 | Chen | ..................... | F28D 15/046 |

(Continued)

FOREIGN PATENT DOCUMENTS

| | | |
|---|---|---|
| CN | 105716461 A | 6/2016 |
| CN | 215261347 U | 12/2021 |
| CN | 215491239 U | 1/2022 |

(Continued)

*Primary Examiner* — Joel M Attey
(74) *Attorney, Agent, or Firm* — HDLS IPR SERVICES; Chun-Ming Shih

(57) ABSTRACT

A vapor chamber and a manufacturing method thereof are disclosed. The vapor chamber includes a first housing, multiple supporting columns, a capillary structure, a second housing, a bonding layer, and a working fluid. The first housing includes an inner surface. Each supporting column is disposed on the inner surface of the first housing and includes an end surface. The capillary structure is disposed on the inner surface of the first housing. The second housing is sealed with the first housing correspondingly to jointly define a chamber. The bonding layer is formed between the inner surface of the first housing and the end surfaces of the supporting columns. The working fluid is arranged inside the chamber. Accordingly, it is able to swiftly changing the positions of the supporting columns according to the actual cooling needs, thereby significantly reducing the manufacturing time required.

2 Claims, 11 Drawing Sheets

(56) References Cited

U.S. PATENT DOCUMENTS

2021/0195799 A1    6/2021  Liu et al.

FOREIGN PATENT DOCUMENTS

| CN | 217686783 U | 10/2022 |
| TW | M327021 U   | 2/2008  |
| TW | 202140984 A | 11/2021 |
| TW | 202200957 A | 1/2022  |
| TW | M633311 U   | 10/2022 |

\* cited by examiner

VAPOR CHAMBER AND MANUFACTURING METHOD THEREOF

BACKGROUND

Technical Field

The technical field relates to a cooling device, and in particular, to a vapor chamber and a manufacturing method thereof.

Description of Related Art

With the rapid development and application of network technologies, users' demand for computer booting speed, software reading speed, image and video playing speed continues to increase, and products capable of saving time efficiently become one of the criteria for consumers to select products.

As the performance and reading speed increases, the heat and temperature of electronic components also increase continuously. However, heat tends to accelerate the aging of most electronic components and to reduce the read and write speed of electronic components of, such as, solid state disk drives. Accordingly, the present disclosure seeks to provide a solution to maintain the working temperature of electronic components.

To overcome the aforementioned cooling issue of electronic components, the industry has developed high performance cooling structures of heat pipes and vapor chambers. The scope covered by vapor chambers is broad, and vapor chambers are known to have short heat conduction path and have cooling performance superior to heat pipes. Therefore, vapor chambers have become the main stream structures for electronic component cooling.

However, the process of a vapor chamber requires the use of large number of molds to perform the procedures of injection, feeding and edge folding. In addition, for a vapor chamber equipped with supporting columns, its manufacturing difficulty is much higher than heat pipes. Furthermore, since different electronic heat generating sources have their own special cooling solution, a vapor chamber cannot be commonly and broadly applied to different electronic heat generating sources. Accordingly, a currently available vapor chamber and its manufacturing method are clearly insufficient to satisfy the use needs of the current stage.

In view of the above, the inventor seeks to overcome the aforementioned drawbacks associated with the known vapor chamber and aims to provide an effective solution through extensive researches along with utilization of academic principles and knowledge.

SUMMARY

An objective of the present disclosure is to provide a vapor chamber and a manufacturing method thereof, which is capable of swiftly changing the positions of the supporting columns according to the actual cooling needs, thereby significantly reducing the manufacturing time required.

To achieve the aforementioned objective, the present disclosure provides a vapor chamber, having a first housing, a plurality of supporting columns, a capillary structure, a second housing, a bonding layer, and a working fluid. The first housing includes an inner surface. Each one of the supporting columns is disposed on the inner surface of the first housing, and each one of the supporting columns includes an end surface. The capillary structure is disposed on the inner surface of the first housing. The second housing is sealed with the first housing correspondingly to jointly define a chamber. The bonding layer is formed between the inner surface of the first housing and the end surface of each one of the supporting columns. The working fluid is arranged inside the chamber.

To achieve the aforementioned objective, the present disclosure further provides a vapor chamber manufacturing method, including the following steps: a) providing a first housing, a plurality of supporting columns, a capillary structure and a second housing, the first housing having an inner surface, and each one of the supporting columns having an end surface; b) providing a bonding paste, applying the bonding paste on one of the inner surface of the first housing and the end surface of each one of the supporting columns, and forming a bonding layer through attachment; c) disposing a capillary structure on the inner surface of the first housing and performing attachment; d) sealing the second housing to the first housing correspondingly to jointly form a chamber; and e) providing a working fluid, filling the working fluid into the chamber, and performing a degassing and sealing process.

DETAILED DESCRIPTION

Figure 1:
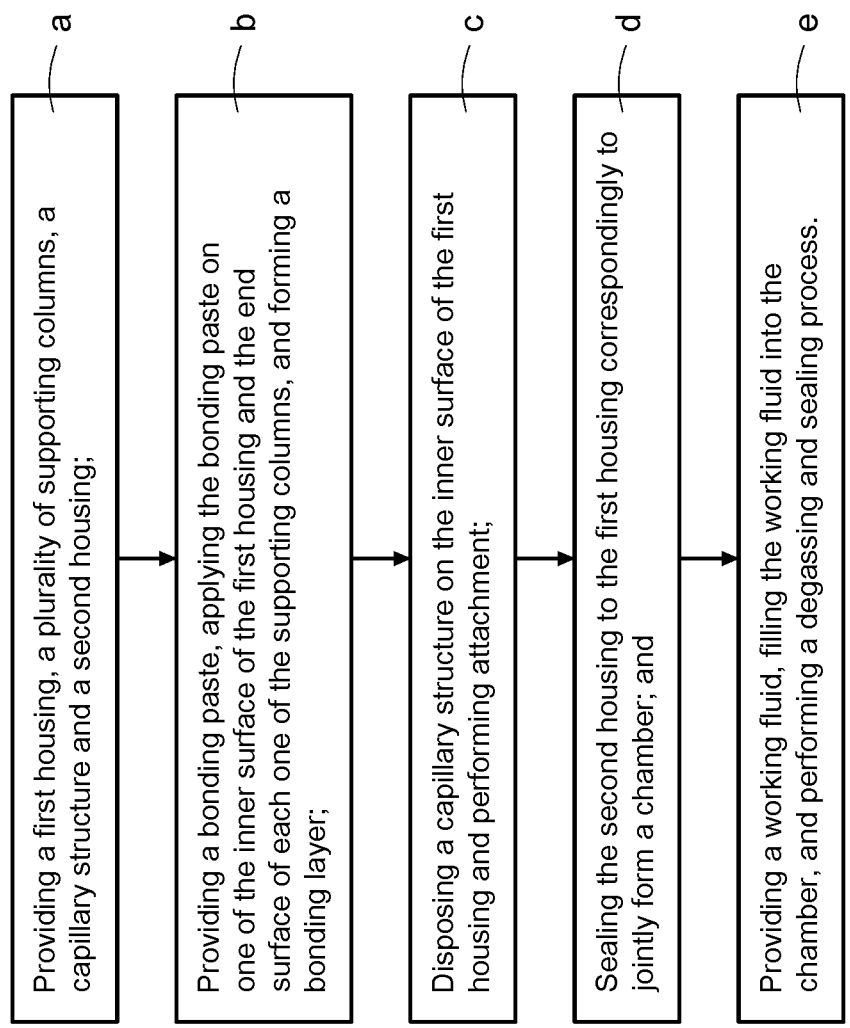
FIG. 1 is a block diagram showing a vapor chamber manufacturing method of the present disclosure.

The technical contents of this disclosure will become apparent with the detailed description of embodiments accompanied with the illustration of related drawings as follows. It is intended that the embodiments and drawings disclosed herein are to be considered illustrative rather than restrictive.

Please refer to FIG. 1 to FIG. 6, the present disclosure discloses a vapor chamber manufacturing method, the method includes the following steps:

a) Providing a first housing 10, a plurality of supporting columns 20, a capillary structure 30 and a second housing 40, the first housing 10 having an inner surface 11, and each one of the supporting columns 20 having an end surface 21.

Figure 2:
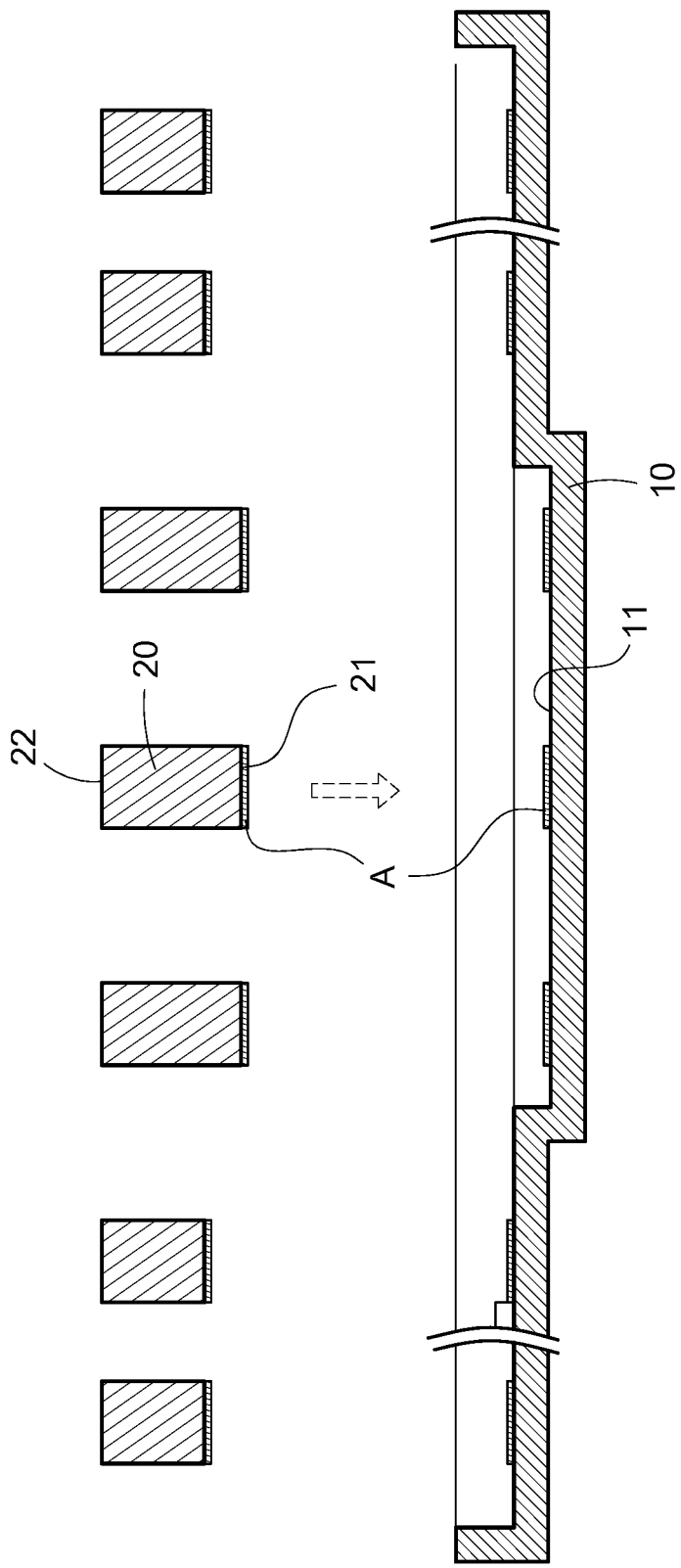
FIG. 2 is an exploded view of the first housing and the supporting columns of the present disclosure.
Figure 6:
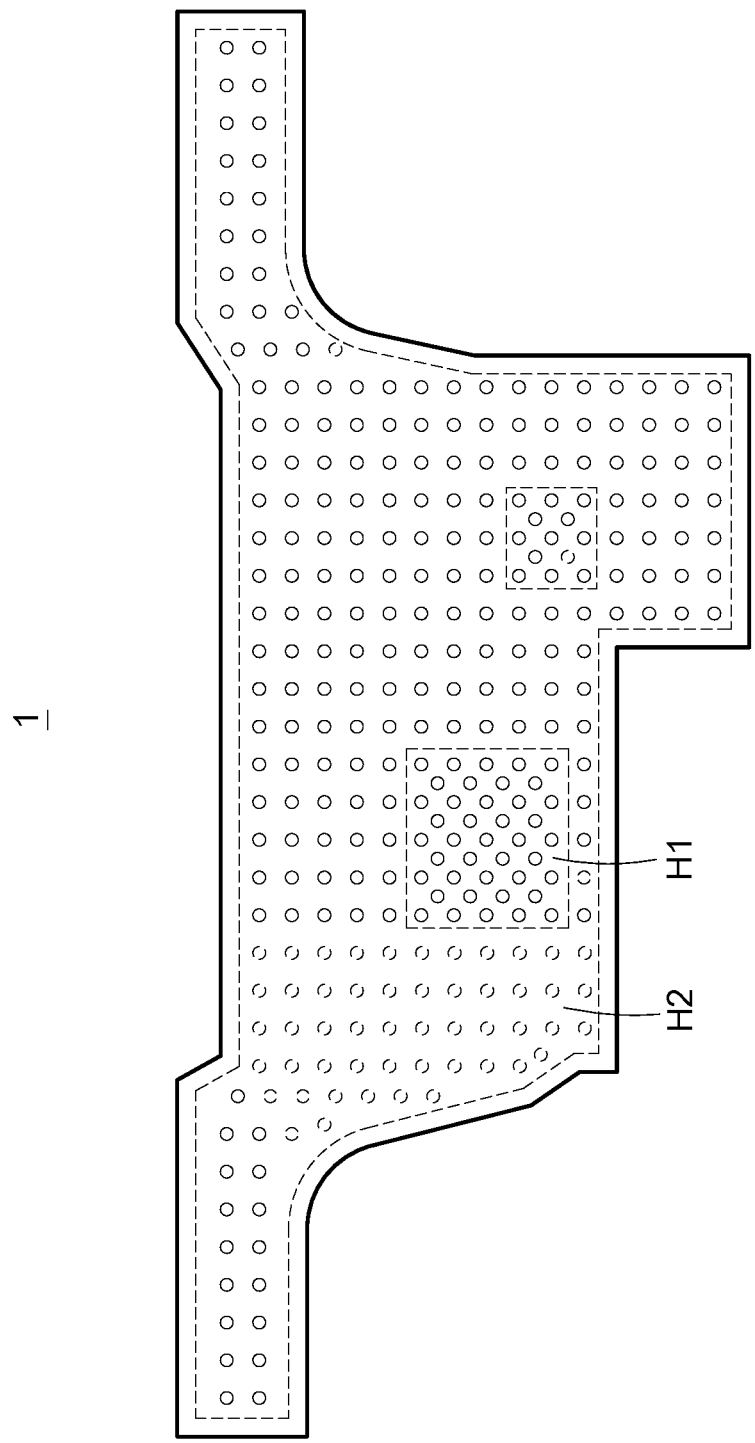
FIG. 6 is a top view of the vapor chamber of the present disclosure.

Please refer to FIG. 2 and FIG. 6. The first housing 10 may have a geometric shape or irregular shape according to an environment where various different electronic heat generating sources (not shown in the drawings) are located, and it may be made of a material of desirable thermal conductivity, such as copper, aluminum, magnesium, or an alloy thereof. The first housing 10 includes an inner surface 11.

The supporting columns 20 may also be made of a material of desirable thermal conductivity, such as copper, aluminum, magnesium, or an alloy thereof, and it may be a solid circular column. The end portion of each supporting column 20 includes an end surface 21, and the top portion of each supporting column 20 includes another end surface 22.

Figure 3:
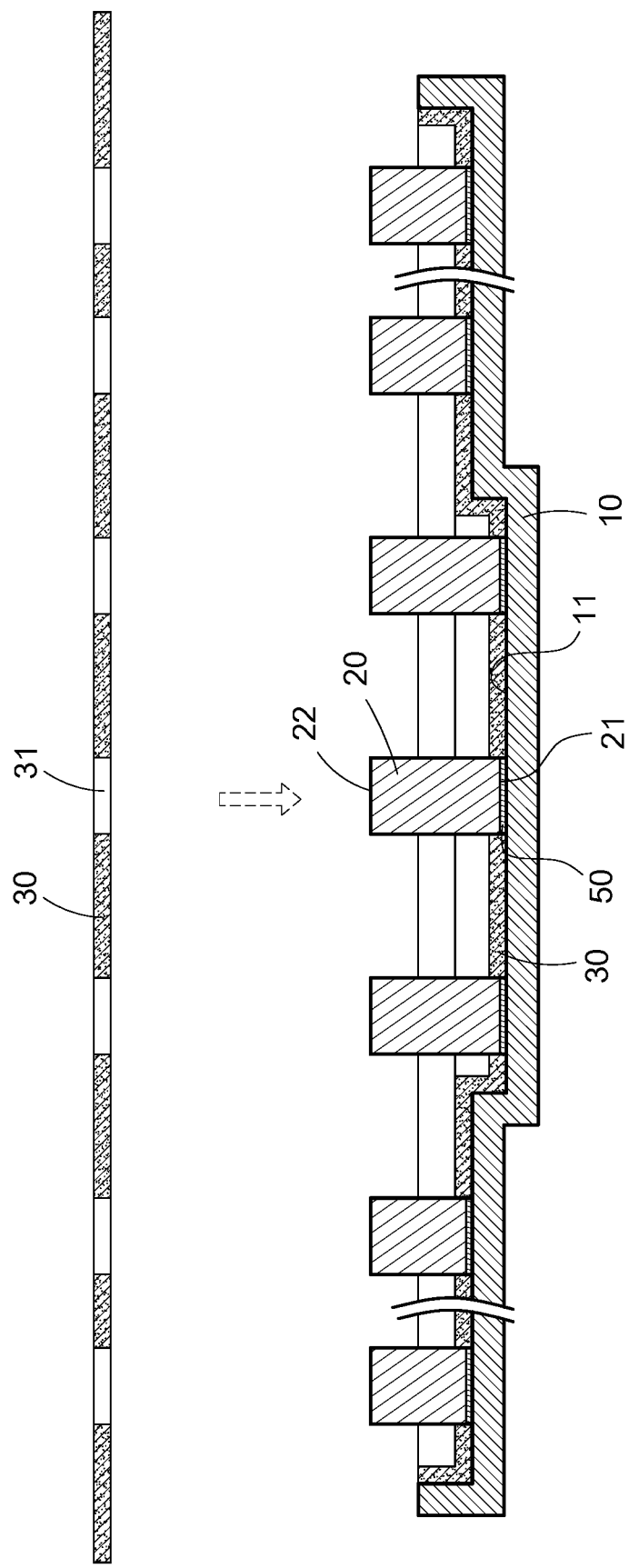
FIG. 3 is a schematic view showing the capillary structure attached to the first housing of the present disclosure.
Figure 4:
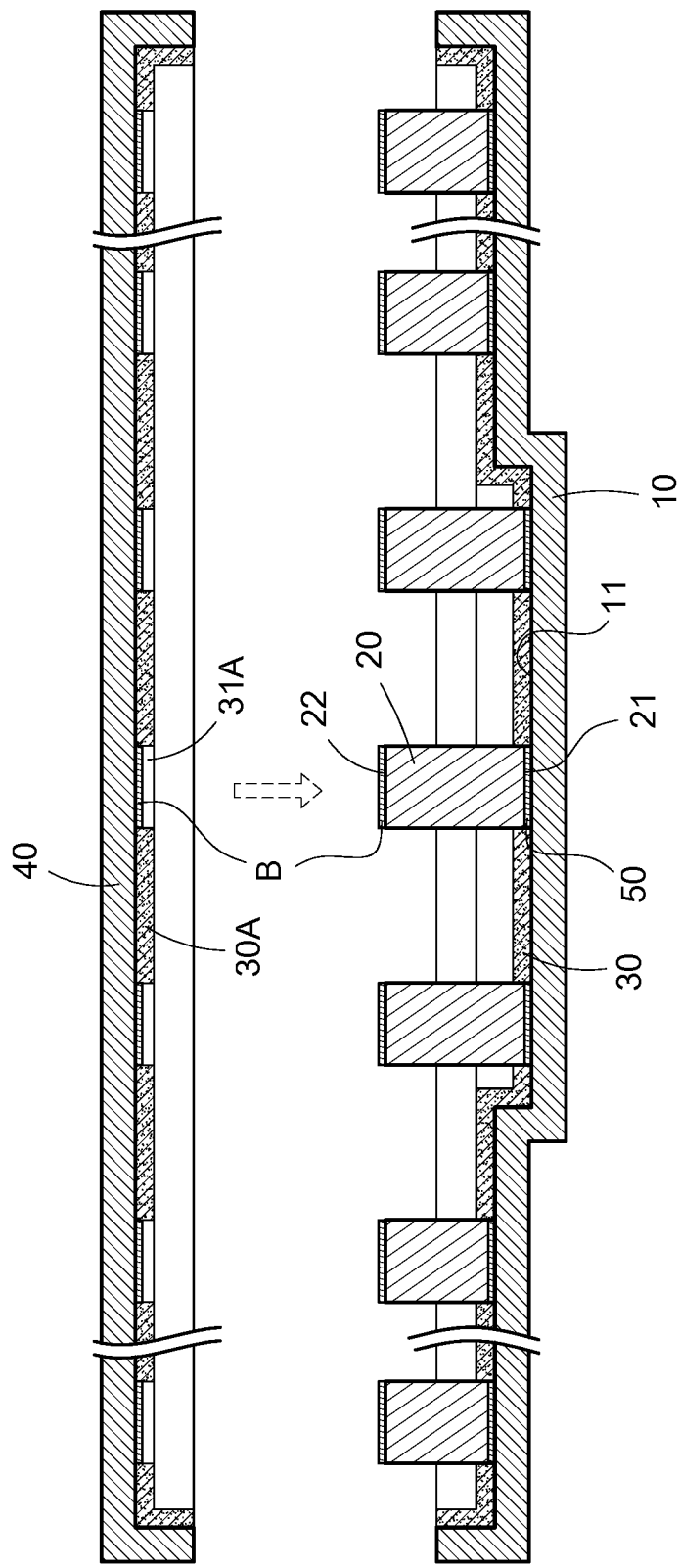
FIG. 4 is a schematic view showing the second housing attached to the first housing of the present disclosure.

Please refer to FIG. 3. The capillary structure 20 may be made of a material of desirable capillary absorption, such as a metal mesh, a porous sintered powder and fiber bundle, and its shape is generally similar to the shape of the first housing 10 to dispose on and cover the inner surface 11 of the first housing 10 completely. The capillary structure 30 includes a through hole 31 respectively formed at a location corresponding to each one of the supporting columns 20.

Figure 5:
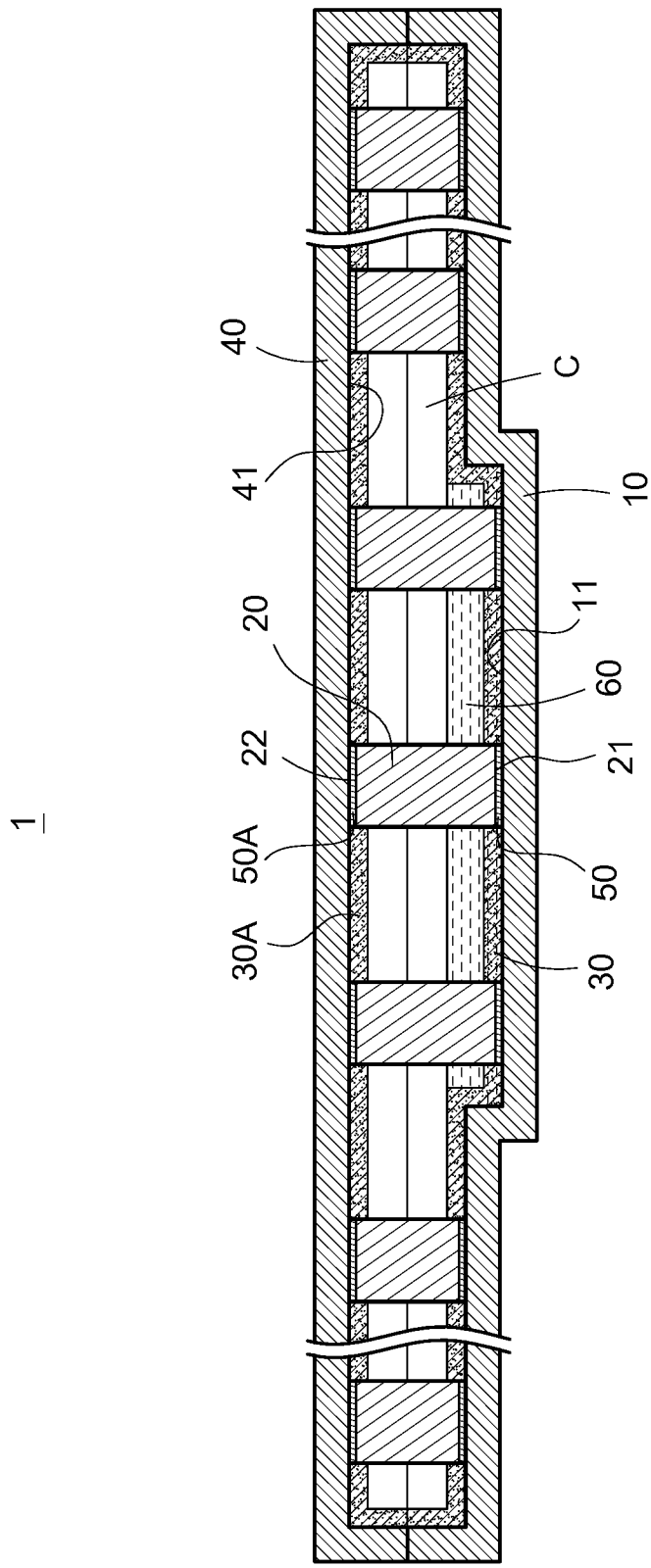
FIG. 5 is an assembly cross-sectional view of the vapor chamber of the present disclosure.

The second housing 40 may also be made of a material of desirable thermal conductivity, such as copper, aluminum, magnesium, or an alloy thereof, and its shape matches with the shape of the first housing. The second housing 10 also includes an inner surface 41 (as shown in FIG. 5).

b) Providing a bonding paste A, applying the bonding paste A on one of the inner surface 11 of the first housing 10 and the end surface 21 of each one of the supporting columns 20, and forming a bonding layer 50 through attachment. Please refer to FIG. 2 and FIG. 3. The bonding paste A is a copper paste made of the material of copper powder base mixed bonding agent. In this step, the bonding paste A may be applied to a predefined location of the inner surface 11 of the first housing 10 corresponding to each one of the supporting columns 20, or the bonding paste A may be applied to the end surface 21 of each one of the supporting columns 20, or it may be applied to both of the surfaces. Next, the end surface 21 of each one of the supporting columns 20 is vertically arranged at the predefined location of the inner surface 11 of the first housing 10, and a heating and pressurizing attachment process is performed to allow the bonding paste A to form a bonding layer 50.

c) Disposing the capillary structure 30 on the inner surface 11 of the first housing 10 and performing attachment. Please refer to FIG. 3, in this step, each one of the through holes 31 of the capillary structure 30 is attached to each one of the supporting columns 20 correspondingly such that the capillary structure 30 is disposed to cover the inner surface 11 of the first housing 10 completely. In addition, by performing a thermal diffusion welding process, the capillary structure 30 is bonded to the inner surface 11 of the first housing 10.

d) Sealing the second housing 40 to the first housing 10 correspondingly to jointly form a chamber C. Please refer to FIG. 4. In this step, the second housing 40 covers the first housing 10 correspondingly, and a seal welding process is performed at the attachment area between the first housing 10 and the second housing 40 to form a chamber C (as shown in FIG. 5) between the first housing 10 and the second housing 40.

e) Providing a working fluid 60, filling the working fluid 60 into the chamber C, and performing a degassing and sealing process. Please refer to FIG. 5. In this step, the working fluid 60, such as a pure water, is filled into the chamber C, and a degassing and sealing process is performed to allow the chamber C to become a vacuum chamber.

Please refer to FIG. 5. A vapor chamber obtained via the aforementioned manufacturing method mainly includes a first housing 10, a plurality of supporting columns 20, a capillary structure 30, a second housing 40, a bonding layer 50 and a working fluid 60. The first housing 10 includes an inner surface 11. Each one of the supporting columns 20 is disposed on the inner surface 11 of the first housing 10, and each one of the supporting columns 20 includes an end surface 21. The capillary structure 30 is disposed on the inner surface 11 of the first housing 10.

The second housing 40 is sealed with the first housing 10 correspondingly to jointly form a chamber C. The bonding layer 50 is formed between the inner surface 11 of the first housing 10 and the end surface 21 of each one of the supporting columns 20. The working fluid 60 is arranged inside the chamber C.

Please refer to FIG. 6. The distribution of the supporting columns 20 may be arranged via an equal distance manner. The vapor chamber includes a primary cooling zone H1 (area shown inside the dashed lines in the drawing) and a secondary cooling zone H2 (area shown outside the dashed lines in the drawing). The primary cooling zone H1 is arranged corresponding to each electronic heat generating source. The secondary cooling zone H2 is formed at the outer perimeter of each electronic heat generating source. The distribution density of the supporting columns 20 at the primary cooling zone H1 is greater than the distribution density of the supporting columns 20 at the secondary cooling zone H2 of the vapor chamber.

According to an exemplary embodiment of the present disclosure, the vapor chamber manufacturing method of the present disclosure further includes a step d0), the step d0) providing another bonding paste B, the second housing 40 having an inner surface 41, each one of the supporting columns 20 having another end surface 22, applying the another bonding paste B on one of the inner surface 41 of the second housing 40 and the another end surface 22 of each one of the supporting columns 20, and forming another bonding layer 50A through attachment. Please refer to FIG. 4. In this step, the another bonding paste B is applied to the predefined location of the inner surface 41 of the second housing 40 corresponding to each one of the supporting columns 20, or the bonding paste B is applied to the another end surface 22 of each one of the supporting columns 20, or it may also be applied to both of the surfaces. Next, the second housing 40 covers the first housing 10 correspondingly, and a heating and pressurizing attachment process is performed to allow the another bonding paste B to form another bonding layer 50A.

In an exemplary embodiment, the step d0) is performed before the step d).

In an exemplary embodiment, the step d0) and the step d) are performed simultaneously.

Figure 7:
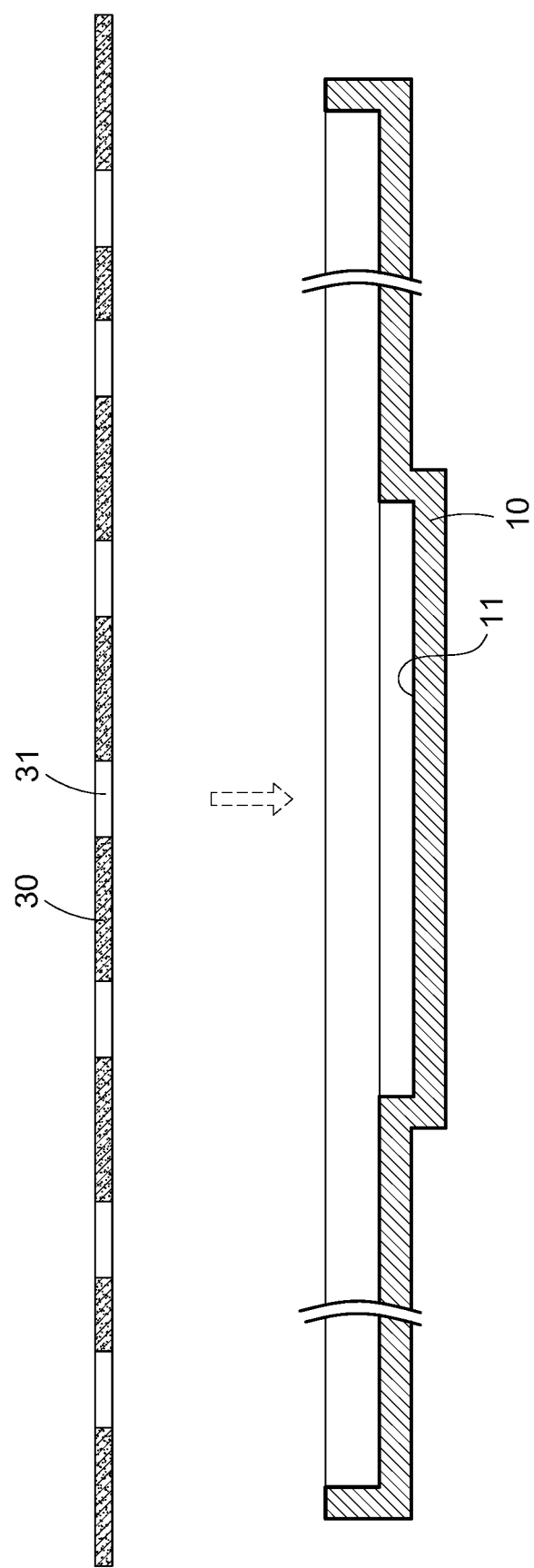
FIG. 7 is a schematic view showing the capillary structure attached to the first housing according to another exemplary embodiment of the present disclosure.
Figure 8:
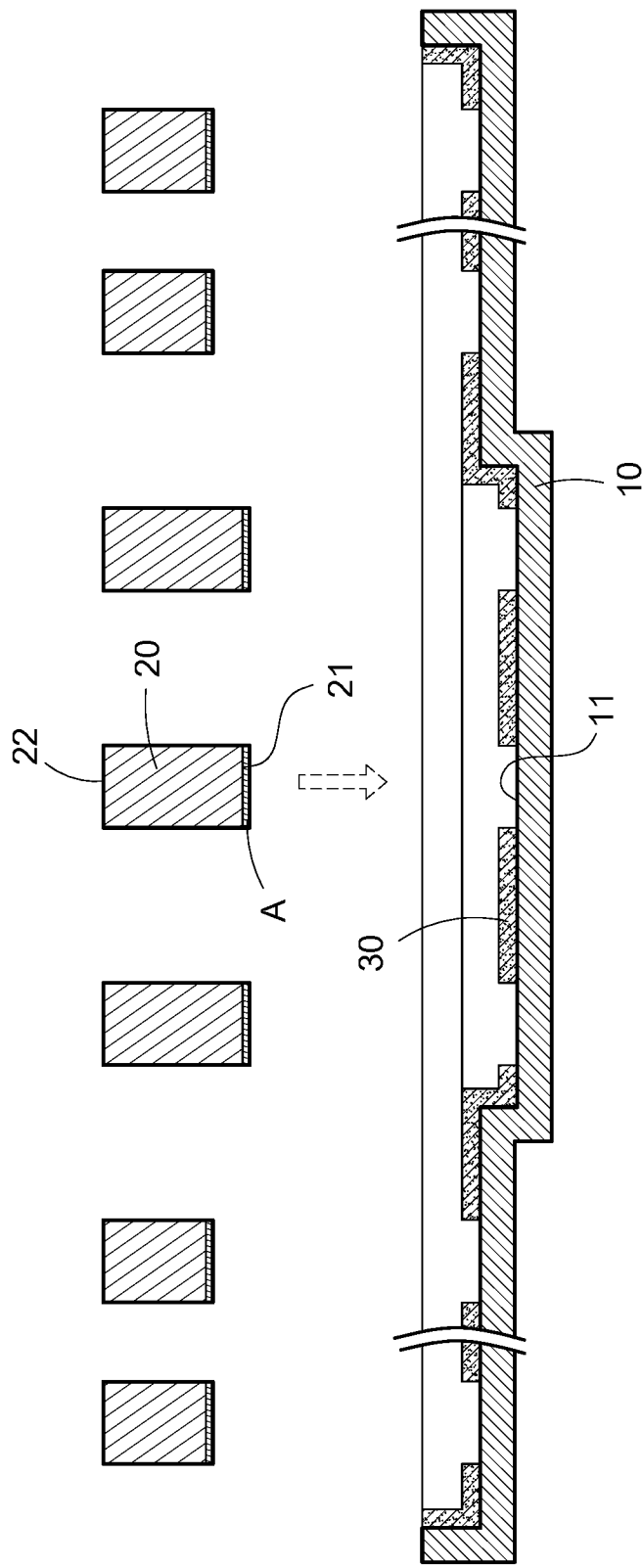
FIG. 8 is a schematic view showing the supporting columns attached to the first housing according to another exemplary embodiment of the present disclosure.
Figure 9:
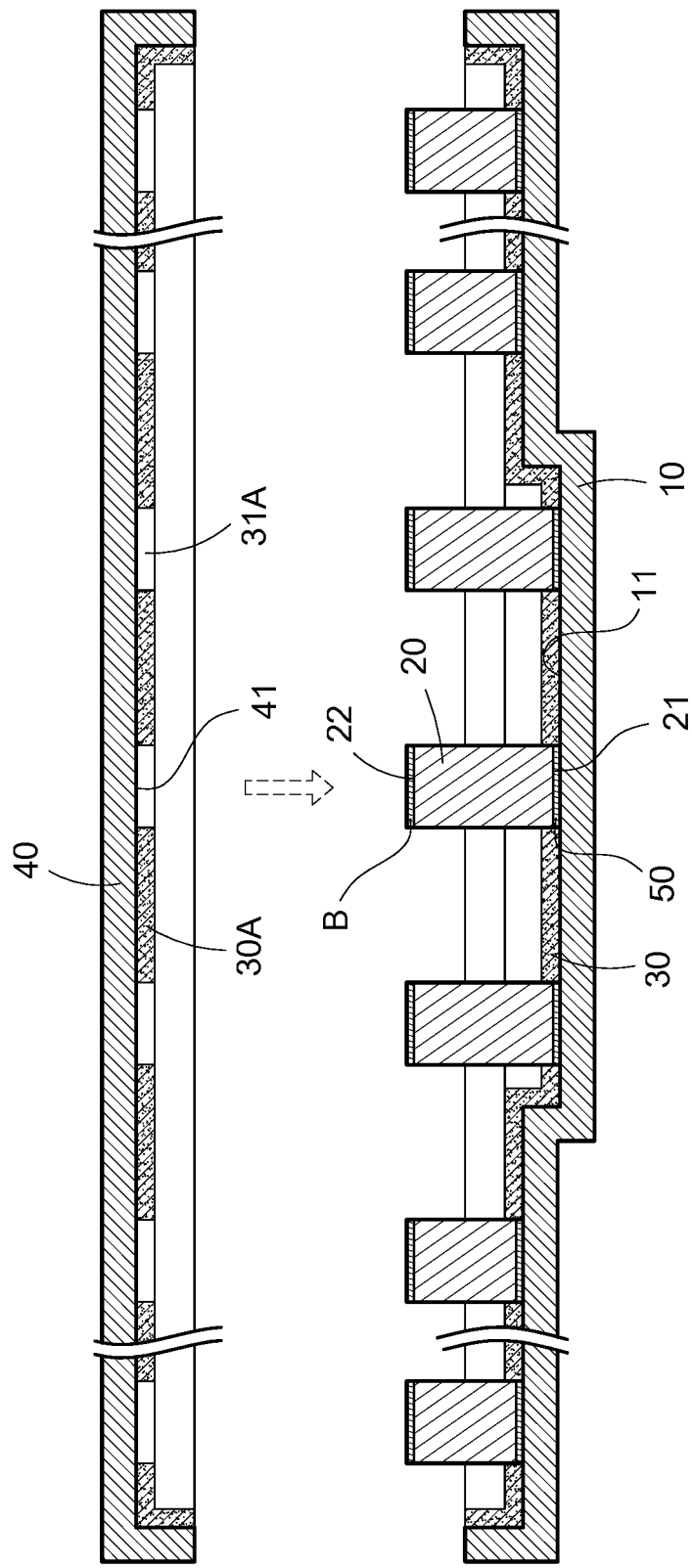
FIG. 9 is a schematic view showing the second housing attached to the first housing according to another exemplary embodiment of the present disclosure.

Please refer to FIG. 7 to FIG. 9. In addition to the aforementioned exemplary embodiments of the vapor chamber manufacturing method of the present invention, in another exemplary embodiment, the step c) may also be performed before the step b). It shall be noted that the bonding paste A in this exemplary embodiment is applied to the lower portion of the end surface 21 of each one of the supporting columns 20 only (as shown in FIG. 8), and the another bonding paste B is applied to the top portion of the another end surface 22 of each one of the supporting columns 20 only (as shown in FIG. 9).

Figure 10:
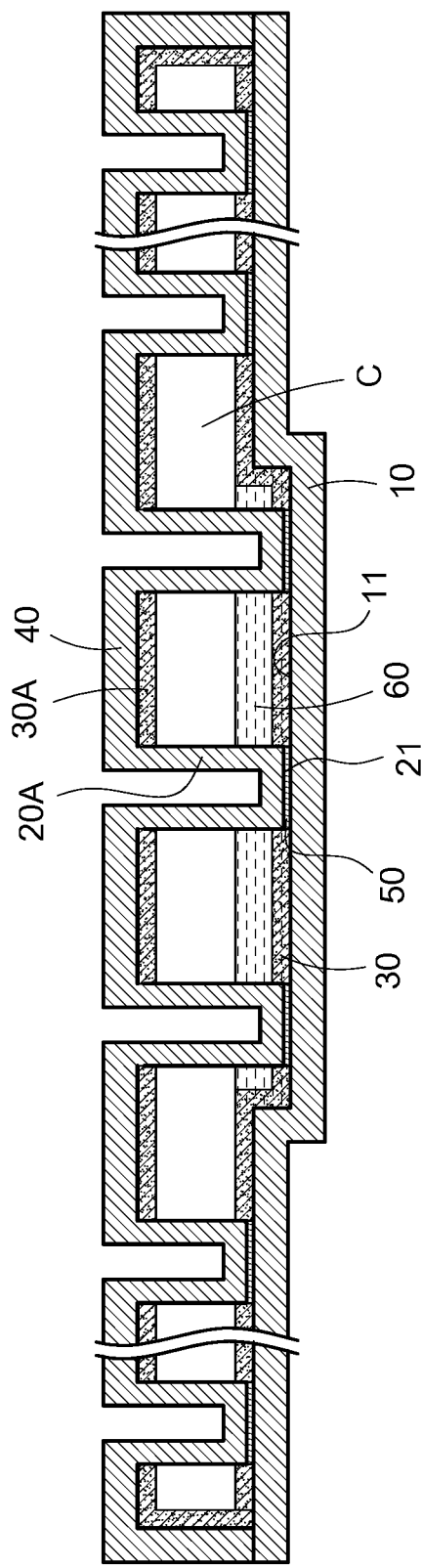
FIG. 10 is an assembly cross-sectional view according to another exemplary embodiment of the present disclosure.

Please refer to FIG. 10. In addition to the separate arrangement of the second housing 40 and the supporting columns of the vapor chamber described in different exemplary embodiments above, the supporting columns 20A may also be formed via such as direct injection molding of the second housing 40, and each one of the supporting column 20A is a hollow member.

Figure 11:
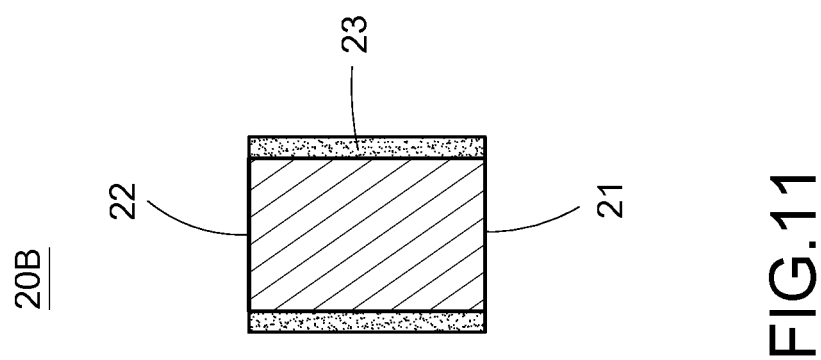
FIG. 11 is a cross-sectional view of the supporting columns according to another exemplary embodiment of the present disclosure.

Please refer to FIG. 11. In addition to different exemplary embodiments of the supporting columns of the vapor chamber of the present disclosure described above, each one of the supporting columns 20B may further include a capillary tissue 23 covering a circumferential surface of the supporting column 20. The capillary tissue 23 may be made of a material of desirable capillary absorption, such as porous sintered powder or fiber bundle. It is mainly disposed inside the primary cooling zone H1.

In view of the above, the vapor chamber and the manufacturing method thereof of the present disclosure are able to achieve the expected purpose of use and to overcome known drawbacks.

What is claimed is:

1. A vapor chamber, comprising:
   a first housing, comprising a first inner surface;
   a first capillary structure, disposed on the first inner surface;
   a second housing, comprising a second inner surface, sealed with the first housing correspondingly to jointly define a chamber;
   a second capillary structure, disposed on the second inner surface;
   a plurality of supporting columns disposed in the chamber, each one of the supporting columns comprising a first end surface and a second end surface:
   a first bonding layer, formed between the first inner surface and entirely the first end surface;
   a second bonding layer, formed between the second inner surface and the second end surface;
   a primary cooling zone offset from the center of the vapor chamber and a secondary cooling zone, wherein a distribution density of the supporting columns in the primary cooling zone is greater than a distribution density of the supporting columns in the secondary cooling zone; and
   a working fluid, arranged inside the chamber,
   wherein the first capillary structure is a metal mesh comprising a plurality of first through holes, and each one of the first through holes is adapted to sheathe each one of the supporting columns to be fixed on the first inner surface correspondingly;
   wherein the first bonding layer and a second bonding layer comprise a curing copper paste made of a copper powder base mixing with a bonding agent:
   wherein the second capillary structure comprises a plurality of second through holes, and each one of the second through holes is adapted to sheathe each one of the supporting columns to be fixed on the second inner surface correspondingly.

2. The vapor chamber according to claim 1, wherein each one of the supporting columns further comprises a capillary tissue covering a circumferential surface thereof.

* * * * *